United States Patent

Schulz et al.

Patent Number: 5,208,102
Date of Patent: May 4, 1993

[54] COATED HIGHLY WEAR-RESISTANT TOOL AND PHYSICAL COATING PROCESS THEREFOR

[75] Inventors: Hans Schulz, Balzers, Liechtenstein; Karl-Heinz Zehenter, Rankweil, Austria; Erich Bergmann, Mels, Switzerland

[73] Assignee: Balzers Aktiengesellschaft, Balzers, Liechtenstein

[21] Appl. No.: 822,604

[22] Filed: Jan. 17, 1992

[30] Foreign Application Priority Data

Jan. 21, 1991 [CH] Switzerland ............... 150/91

[51] Int. Cl.$^5$ ................................ B32B 7/02
[52] U.S. Cl. ................... 428/336; 428/697; 428/698; 428/702; 428/704; 51/307; 51/309
[58] Field of Search ............. 428/336, 697, 698, 702, 428/704; 51/295, 307, 309

[56] References Cited

U.S. PATENT DOCUMENTS 4,714,660 12/1987 Gates Jr. ...................... 428/698
4,753,854 6/1988 Gavrilov et al. ............. 428/702
4,842,710 6/1989 Freller et al. ................ 427/37

OTHER PUBLICATIONS

Quinto et al., "High Temperature Microhardness of Hard Coatings Produced by Physical and Chemical Vapor Deposition", *Thin Solid Films*, 153 (1987) pp. 19-36.

Beensh Marchwicka et al., "Structure of Thin Films Prepared by Cosputtering of Titanium and Aluminum or Titanium and Silicon", *Thin Solid Films*, 82 (1981) pp. 313-320.

*Primary Examiner*—Henry F. Epstein
*Assistant Examiner*—A. A. Turner
*Attorney, Agent, or Firm*—Notaro & Michalos

[57] ABSTRACT

Coated highly wear-resistant tools have an $Me^1_{1-x}(a_2Me^2 * a_3Me^3 * \ldots a_nMe^n)_x N_u C_v O_w$ coating, wherein $Me^1$ is a metal of the chemical group IVb of the periodic system, and $Me^2, Me^3, \ldots, Me^n$ are other metals. The values $u+v+w=1$ and the Me concentration changes at least once continuously over the layer thickness to $a_2Me^2 * a_3Me^3, \ldots a_nMe^n$. The value for x is preferably between 0.1 and 0.7, the values for v and/or w can be approximately zero or $w<0.3$, and the further metal $Me^2, Me^3, \ldots, Me^n$ is another metal of the chemical group IVb of the periodic system and/or vanadium and/or preferably aluminum. In working tasks with the tools according to the invention as compared to known tools, a significantly increased service life is obtained. In the production of the coating, a physical coating process is used, in which the ratio of at least two streams of vapor onto the basic body of the tools is varied in such a way that on the basic bodies, a coating with continuously alternating material concentration is obtained.

12 Claims, 1 Drawing Sheet

COATED HIGHLY WEAR-RESISTANT TOOL AND PHYSICAL COATING PROCESS THEREFOR

FIELD AND BACKGROUND OF THE INVENTION

The present invention related is generally to coating techniques, and in particular to a new and useful wear-resistant tool, and process for coating such a tool.

A wear-resistant coated tool is known, for example, from DE-PS 35 12 986. In the case of the known tool, several discrete layers having a layer thickness between 0.002 and 0.1 $\mu$m are applied onto a metallic surface by means of a cathode sputtering or other PVD (physical vapor deposition) method. For the application of the layers the surfaces of the basic tool body are moved during the entire coating process relative to at least two sputtering cathodes with different mechanically resistant materials as cathode.

TiC and TiB$_2$, TiN and TiB$_2$, TiC and TiN and TiB$_2$, TiB$_2$ and WC, TiB$_2$ and Ti(C,N), TiB$_2$ and (Ti, V)C, TiB$_2$ and (Ti, W)C, (Ti, V)B$_2$ and (Ti, V)C, (Ti,Nb)B$_2$ and (Ti,Nb)C, VB$_2$ and TiN, VB$_2$ and WC, HfB$_2$ and TaC, ZrB$_2$ and TaC or ZrB$_2$ and NbC were used as the sputtering cathodes. Here, the emphasis in the coating is placed on the formation of a large number of inner phase boundaries.

The service life of these tools during uninterrupted machining at high speeds leaves something to be desired.

SUMMARY OF THE INVENTION

The invention is based on the task of creating a highly wear-resistant coated tool which exhibits satisfactory results even in uninterrupted machining at high speeds.

The solution of the task with respect to the tool is characterized by an Me$^1_{1-x}$ ($\alpha_2$Me$^2$ * $\alpha_3$Me$^3$* ... $\alpha_n$Me$^n$) $_x$N$_u$C$_y$O$_w$ coating in which the Me$^1$ concentration relative to the ($\alpha_2$Me$^2$ * $\alpha_3$Me$^3$ * ... $\alpha_n$Me$^n$) concentration changes at least once continuously over the layer thickness of the coating, wherein Me$^1$ is a metal of the chemical group IVb of the periodic system, Me$^2$, Me$^3$, ..., Me$^n$ are other metals from the same or another chemical group, $\alpha_2$, $\alpha_3$, ... $\alpha_n$, being the mixed fractions of the other metals with respect to each other, u, v, w and x are between 1 zero and u+v+w=1. Mixed fractions $\alpha_2$, $\alpha_3$ ... $\alpha_n$ are defined such that $\alpha_2+\alpha_3+ ... \alpha_n=100\%$, if the fractions are expressed in percentages, or $\alpha_2+\alpha_3+ ... 1$, if the fraction are expressed in "part per".

The process for coating the tool is characterized in that the ratio of at least the two streams of vapor onto the basic bodies of the tools is varied in such a way that on the basic bodies a coating is obtained with continuously alternating material concentration.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which the preferred embodiments of the invention are illustrated.

BRIEF DESCRIPTION OF THE DRAWINGS

In the following, an example for the production of a tool according to the invention is explained in greater detail with reference to the drawings wherein.

DESCRIPTION OF THE PREFERRED EMBODIMENTS

Figure 1:
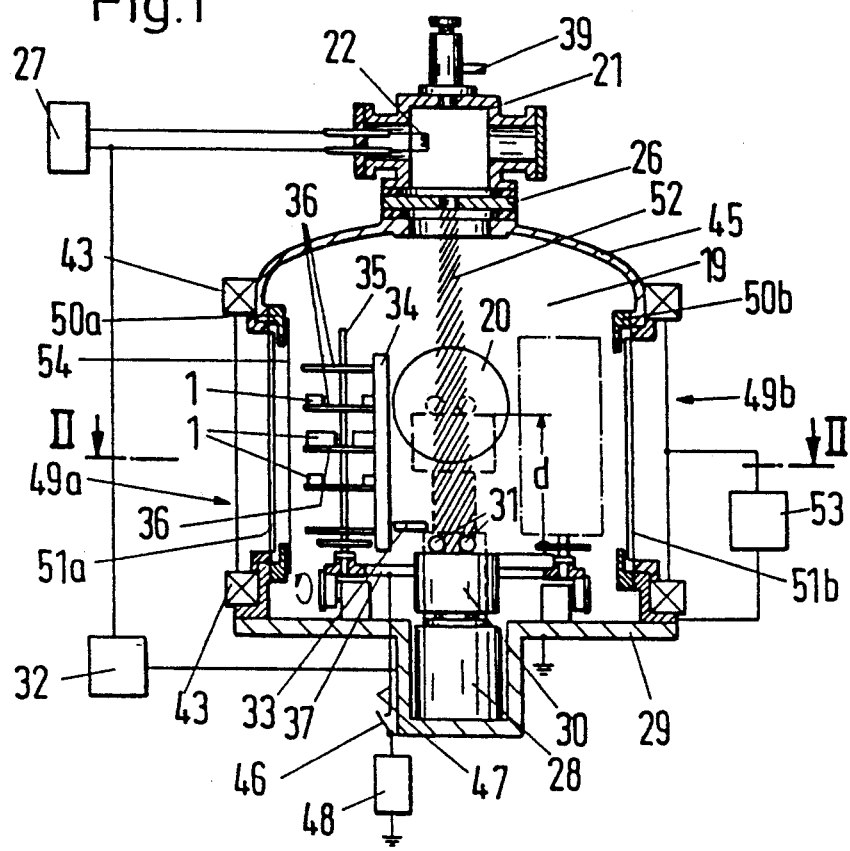
FIG. 1 is a section through a vapor deposition installation depicted schematically.

FIG. 1 shows by example a schematic representation of vapor deposition installation for creating the highly wear-resistant coating with alternating material concentrations according to the invention. The vapor deposition installation comprises a vacuum chamber 19 with an evacuation port 20 and a glow cathode chamber 21 kept electrically insulted from the vacuum chamber 19 by a pin hole diaphragm 26. The glow cathode 22 is fed power by a current supply apparatus 27. Below the pin hole of the pin hole diaphragm 26 and above the bottom 29 of the vacuum chamber 19, a coolable height-adjustable crucible 30 is placed, with titanium 31 thereon, as the vapor deposition material. In FIG. 1 the crucible 30 is shown in phantom lines, displaced by a distance d from its lowermost position. The height adjustment of the crucible 30 takes place via a moving device 28 which is displaceable with respect to height. It comprises three cylinders telescopingly displaceable with a spindle guidance. The titanium 31 in the crucible 30 is coverable with a displaceable screen 33.

Figure 2:
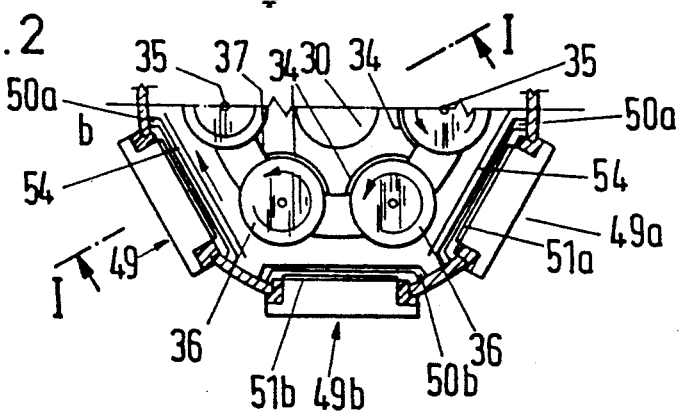
FIG. 2 is a section through the vapor deposition installation depicted in FIG. 1 and taken along line II—II, wherein, due to rotational symmetry, only one half of the vapor deposition installation is shown.

Six electrically conducting carriers 35 are present in the vacuum chamber 19 and are rotatable about the longitudinal axis of the chamber 19. Four such carriers are indicated in FIG. 2. Basic bodies 1 of tools of high-speed steel S 6-5-2 are held on retainers 36 carried on each carrier 35. The carriers 35 are rotatably about their own axis on a rotary tray 37 and through it are electrically connected to each other. The rotary tray 37 is electrically insulated relative to the bottom 29 and the walls of the vacuum chamber 19. The retainers 36 are connected electrically to the carriers 35. The basic bodies 1 held on the retainers 36 are coverable with a screen 34 represented schematically in FIGS. 1 and 2 against the titanium 31 disposed in the crucible 30.

A gas feed line 39 terminates in the glow cathode chamber 21 and is connected via the pin hole of the diaphragm 26, to the vacuum chamber 19. One magnetic coil 43, represented schematically, is disposed just above the bottom 29 and adjoining a cover part 45 of the vacuum chamber 19 for the generation of an approximately parallel vertical magnetic field.

The rotary tray 37 is connected via an electrical line 47 and a closable switch 46 to a variable voltage generator 48 whose other pole is at ground.

In the vertical walls of the vacuum chamber 19 three alternating arrangements 49a and three alternating arrangements 49b for cathode sputtering are disposed. Three are depicted in FIG. 2. Each of the arrangements 49a and 49b are provided with a heat exchanger for cooling (not shown). Within a ring 50a or 50b respectively of the arrangement 49a or 49b is disposed a target 51a or 51b, respectively, isolated from it, with a titanium aluminum alloy of 25 atom percent titanium which is connected to the negative pole of a variable voltage source 53. The positive pole of the voltage source 53 is connected to the walls of the vacuum chamber 19 and the rings 50a and 50b. The glow cathode 22 and the crucible 30 are connected via electrical lines to a variable current supply apparatus 32. The six arrangements 49a and 49b are each coverable by one screen 54 depicted schematically in FIGS. 1 and 2 against the basic bodies 1 on the retainers 36.

In order to coat tools for machining work, for example, drills or milling cutters, their basic bodies 1 are fastened to the retainers 36 of the carriers 35, titanium 31 is placed into the crucible 30, and the targets 51a and 51b are provided with the above stated titanium aluminum alloy of 25 atom percent titanium which are placed into the arrangements 49a or 49b respectively. Subsequently the vacuum chamber 19 is closed, evacuated, and the surfaces of the basic bodies 1 to be coated are heated according to one of the methods described in DE-OS 34 06 953 or CH-P 658 545 with a low-voltage arc 52 burning from the glow cathode 22 to the crucible 30 and purified according to the method described in CH-P 631 743. During this time the screen 33 covers the titanium 31 in the crucible 30.

After heating and purification of the surfaces of the basic bodies 1 to be coated, a titanium base layer is applied onto the basic body 1 by means of ion plating such as described, for example, in DE-OS 28 23 876. Through the gas feed line 39, argon is introduced into the vacuum chamber 19 until a partial pressure of 0.2 Pa is obtained. The basic bodies 1 are electrically floating. The rotary trays 37 rotate with the carriers 35 rotating on them at a rate of approximately six rotations per minute. The basic bodies 1 to be coated rotate past the targets 51a and 51b. The screen 33 is slid back from the titanium 31, and the screen 34 is slid back from the basic bodies 1. A very thin layer 5 of a few tens of nanometers of titanium is then applied onto the basic bodies 1.

Subsequently nitrogen is introduced at 120 standard $cm^3$ per minute through the gas feed line 39 into the vacuum chamber 19 and as soon as the nitrogen flow is stabilized, voltage is applied to the arrangements 49a and 49b for cathode sputtering and a negative voltage of approximately 50 V is applied to the rotary tray 37. Subsequently the nitrogen flow is increased to 250 standard $cm^3$ per minute whereby the total pressure in the vacuum chamber 19 is raised to 0.3 Pa.

Figure 3:
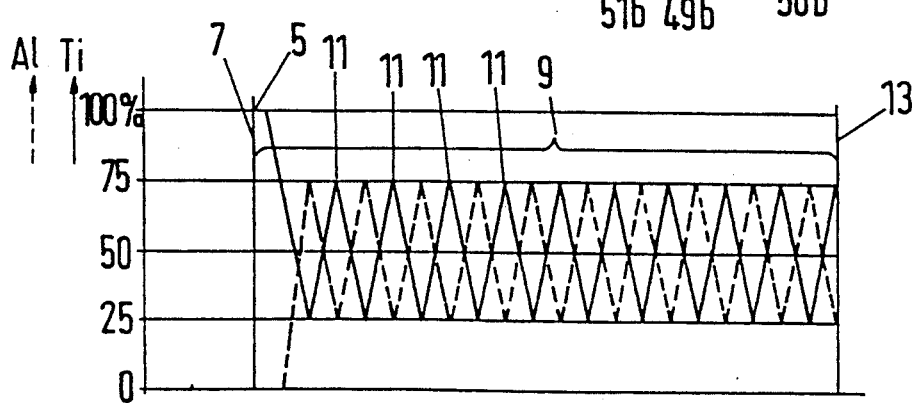
FIG. 3 is a graph plotting a titanium or aluminum concentration in the layer applied with vapor deposition onto a basic body according to the invention.

The current of the low-voltage arc 52 is regulated up to 200 A with the current supply apparatus 32 and the target power is regulated to be 10 kW with the voltage source 53. The streams of vapor of the titanium and aluminum vaporized from the crucible 30 with the low-voltage arc and sputtered by means of cathode sputtering as well as being partially ionized, combine with the nitrogen in the vacuum chamber 19 and are deposited on the basic bodies 1 as titanium and aluminum nitride. During the entire coating process the arc current is varied between 200 A and 160 A with a ramp of approximately 20 A/min and the power of the cathode sputtering is varied between 10 kW and 15 kW with a ramp of approximately 2.5 kW/min, changing in an approximately delta-shaped manner, and approximately continuously in opposite phase to the arc current. After 40 minutes a 4 μm thick layer 9 with ten titanium compound concentration maxima 11, as shown in FIG. 3, has been formed on the surface 7 of the basic body 1.

Therein the titanium to aluminum concentration ratio in the deposited coating varies continuously between 75 to 25 percent, and 50 to 50 percent, i.e. in the titanium compound concentration maximum 11 the coating comprises $Ti_{0.75}Al_{0.25}N$ and in the titanium compound concentration minimum, the coating comprises $Ti_{0.5}Al_{0.5}N$. In FIG. 3 the profile of the titanium concentration is shown as solid line and the profile of the aluminum concentration as dashed line. The free surface of the coating 9 is denoted by 13 in FIG. 3.

If the current of the low-voltage arc 52 fluctuates about a higher value than the one stated above, the fraction of the titanium nitride can be increased to up to 90 percent ($Ti_{0.9}Al_{0.1}N$) Analogously, it can be decreased to 30 percent ($Ti_{0.3}Al_{0.7}N$) through a lower mean arc current.

Instead of varying the powers of the low-voltage arc 52 and the cathode sputtering arrangements 49a and 49b, the crucible 31 can be moved up and down with the moving device 28 once per minute at a constant arc current of 200 A. It is also possible to change the power of the low-voltage arc 52, the power of the cathode sputtering arrangements 49a and 49b during the coating process, as well as to move the crucible up and down.

Instead of using the targets 49a and 49b with a titanium aluminum alloy, three targets 51a of titanium and three targets 51b of aluminum can be used, wherein in that case in comparison to the above stated powers, lower values must be used.

Instead of using only the reactive nitrogen atmosphere, a nitrogen/oxygen mixture with a gas giving off carbon such as for example acetylene or ethane can be used, wherein the oxygen content should be less than 30 percent by volume of the mixture. Depending on the power of the low-voltage arc 52 and the cathode sputtering arrangement 49a and 49b with a titanium aluminum alloy of the above 25 to 75 atom percent, the coating comprises $Ti_{1-x}Al_xN_uC_vO_w$, wherein $u+v+w=1$ and $w<0.3$.

If a carbonitride layer with $u=0.7$, $v=0.3$ and $w=0$ is to be generated, the nitrogen flow is reduced to 160 standard $cm^3$ and additionally an acetylene flow at 100 standard $cm^3$ is introduced. The process parameters are adapted accordingly.

The number of titanium compound concentration maxima in the entire coating, the layer thickness as well as the titanium compound concentration maxima per micrometer of layer thickness depend on the use of the coated tools, wherein, in the case of tools which are used for uninterrupted cutting with strong impact loading, up to 50, and preferably 15 of maxima are chosen and in the case of tools for primarily uninterrupted cutting, at least 2, and preferably 8 maxima are chosen.

If the distance between adjacent the titanium compound concentration maxima is increased in the direction toward the free surface of the coating, the resistance against abrasion wear is increased, wherein in the case of tool utilization for primarily continuous cutting with strong abrasive workpiece materials a distance of the last maximum from the free surface of 0.5 μm has been found to be advantageous. The layer thickness of the coatings are 1 to 7 μm and preferably 2 to 4 μm.

Service life investigations with HSS spiral drills which are coated according to the process of the invention, are denoted by the reference symbol "4? in the following Tables. They comprise S 6-5-2 and have a diameter of 6 mm. Their basic body has a sulfur content of 0.029% and is hardened and tempered to a strength of 1050 N/mm². They were subjected, together with drills which were not made according to the invention, to service life investigations in conjunction with a determination of a characteristic number of drilled holes. Drilling took place in 42CrMo4 steel.

The reference symbol "1" denotes drills which carry a titanium nitride coated not according to the invention, which was applied only with the low-voltage arc. In the first three minutes titanium was vaporized with a current of 80 A without nitrogen being introduced into the vacuum chamber 19. After a titanium adhesion layer of a few nanometers had formed on the basic body 1, the current of the low-voltage arc was increased to 200 A and nitrogen was introduced into the vacuum chamber with a ramp function up to a partial pressure of $4*10^{-4}$ mbars. After a coating time of 60 minutes a 4 μm titanium nitride layer had been applied on the basic bodies.

The reference symbol "2" denotes drills which carry a titanium aluminum nitride coating not according to the invention, which was produced in such a way, that in addition to the coating process described under "1", titanium and aluminum were sputtered. The target composition was 25% titanium and 75% aluminum. A titanium adhesion layer was likewise applied. Onto this titanium adhesion layer within 5 minutes a 0.3 μm thick titanium nitride intermediate layer was applied. Subsequently, the power of the cathode sputtering arrangement was raised to 10 kW and the arc current of the low-voltage arc to 200 A. These operating data were maintained for 35 minutes until a 4 μm thick coating of a titanium aluminum nitride layer with a titanium to aluminum atom percent ratio of 75 to 25 was obtained.

The reference symbol "3" denotes drills which carry a titanium aluminum nitride coating not according to the invention, which were coated analogously onto the drills with the reference symbol "2". Only an arc current of the low-voltage arc of 160 A and a power of the cathode sputtering arrangement of 15 kW was used whereupon after a coating time of 45 minutes, a 4 μm thick coating with a titanium to aluminum atom percent ratio of 50 to 50 was obtained.

The cutting conditions for the service life investigation were as follows:
cutting rate of 47 m/min,
advance 0.125 mm/U,
cooling with 3% emulsion,
depth of through-bore 15 mm,
number of test drills 10,
end of service life: blank breaking,
at the characteristic hole number a 65% failure probability occurs.

TABLE 1

| Reference Number | Characteristic Hole Number |
|---|---|
| "1" | 550 |
| "2" | 70 |
| "3" | 630 |
| "4" | 1010 |

Analogously to the above drills, service life investigations were carried out on indexable inserts of HSS. Due to the process, the coating thickness on the face was 5 μm and on the free face 4 μm. The insert geometry was SCFT 120508 FN. With the indexable inserts, shafts of unalloyed CK60 steel were machined.

The longitudinal rotation conditions for the service life investigation were as follows:
cutting rate 55 m/min,
advance 0.2 mm/rotation,
cutting depth 2 mm,
cooling with 3% emulsion,
as characteristic service life in minutes served achieving a crater depth of 100 μm.

TABLE 2

| Reference Number | Characteristic Service Life |
|---|---|
| "1" | 8 minutes |
| "2" | 11 minutes |
| "3" | 13.5 minutes |
| "4" | 17 minutes |

In further investigations in conjunction with characteristic service paths using end milling cutters of S 6-5-2-10 with a diameter of 10 mm, the influence of a different number of titanium compound concentration maxima was investigated in conjunction with an above stated carbonitride coating $Ti_{1-x}Al_xN_uC_v$ with u=0.7 and v=0.3 (w=0) per micrometer of layer thickness.

In Table 3 below, under the reference number "5" are listed end milling cutters with a coating not according to the invention with a constant titanium to aluminum atom ratio, wherein a titanium to aluminum atom ratio between 75 to 25 and 50 to 50 was selected. It was found in carrying out the investigations that a different titanium to aluminum atom ratio within the above scope, does not enter into the characteristic service path.

Under the reference number "6" are listed end milling cutters coated according to the invention with 10 titanium compound concentration maxima and under the reference number "7" those with 100 titanium compound concentration maxima per 4 μm, wherein the titanium to aluminum atom percent ratio in the coating varies between 75 to 25 and 50 to 50.

For determining the characteristic service path for the above end milling cutters, the following conditions were selected:
machined material GG 25,
cutting rate 60 m/min,
advance 0.125 mm/rotation,
cutting depth 3 mm,
no cooling,
as characteristic service path served achieving a wear mark width of 200 μm.

TABLE 3

| Reference Number | Characteristic Service Path |
|---|---|
| "5" | 7.5 m |
| "6" | 11 m |
| "7" | 13 m |

In Table 4, reproduced below, further investigations using plunge tools are shown. Plunge tools with the reference number "8" comprise a hard metal of type M15 without coating. Those with reference number "9" are provided with a coating not according to the invention with a constant titanium to aluminum atom ratio, wherein here too the value of the titanium to aluminum atom ratio is not entered.

Under the reference numbers "10" and "11", analogously to the above end milling cutters with the reference numbers "6" and "7", plunge tools coated according to the invention are listed.

For determining a characteristic service quantity of the plunge tools, shafts of X2NiCrMo 18 10 were provided with 2.5 mm deep grooves under the following conditions wherein, under service quantity, is understood the number of mill-cut grooves under the following conditions:

cutting rate at the outer diameter of the shaft 160 m/min,
advance 0.05 mm/rotation,
cutting depth 3 mm,
cooling,
as characteristic service criterion serves achieving a roughness on the surface of the groove of $R_z > 1.5$ μm.

TABLE 4

| Reference Number | Number of Mill-Cut Grooves |
|---|---|
| "8" | 50 |
| "9" | 80 |
| "10" | 90 |
| "11" | 130 |

The use of the above stated oxycarbonitride coating with continuously alternating metal compound concentrations results in increased service life of the tools coated in this way.

The increased hole number, the increased service life, the increased service path, and the increased service quantity achievable with the tools coated according to the invention, are clearly evident in the above listed examples.

While specific embodiments of the invention have been shown and described in detail to illustrate the application of the principles of the invention, it will be understood that the invention may be embodied otherwise without departing from such principles.

What is claimed is:

1. Coated highly wear-resistant tool comprising:
a basic body; and
a coating on the basic body with an $Me^1_{1-x} * (a_2Me^2 * a_3Me^3 * \ldots a_nMe^n)_x N_u C_v O_w$ coating in which;
the concentration of $Me^1$ relative to the concentration of $(a_2Me^2 * a_3Me^3 * \ldots a_nMe^n)$ changes continuously during the formation of the coating thickness 2 to 5 times per micrometer between relative maxima and minima of $Me^1$;
$Me^1$ being a metal of the chemical group IVb of the periodic system;
$Me^2, Me^3, \ldots Me^n$ being other metals selected from the chemical group IVb of the periodic system, vanadium and aluminum;
$a_2, a_3, \ldots a_n$ being the mixed fraction of said other metals with respect to each other wherein $a_2 + a_3 + \ldots a_n = 100\%$;
x being between 0.1 and 0.7; and
u, v and w being between 1 and zero, wherein $u+v+w=1$.

2. Tool as stated in claim 1, wherein at least one of v and w is approximately zero.

3. Tool as stated in claim 1, wherein $w < 0.3$.

4. Tool as stated in claim 1, where $Me^1$ is titanium.

5. Tool as stated in claim 4, wherein the coating has a free surface (13) and the distance between adjacent $Me^1$ concentration maxima increases in a direction toward the free surface of the coating.

6. Tool as stated in claim 1, wherein the layer thickness of the coating is 1 to 7 micrometers.

7. Tool as stated in claim 1, wherein the coating comprises single-phase face-centered cubic material.

8. Tool as stated in claim 1, wherein the $Me^1$ concentration changes over the layer thickness as at least an approximately continuous function.

9. Tool as stated in claim 1, wherein $Me^1$ is titanium and said $Me^2$ is aluminum.

10. Tool as stated in claim 9, wherein at least one of v and w is zero.

11. Tool as stated in claim 4, wherein the coating contains, per micrometer of layer thickness, 8 to 15 relative titanium compound concentration maxima.

12. Tool as stated in claim 1, wherein the layer thickness of the coating is 2 to 4 micrometers.

* * * * *

UNITED STATES PATENT AND TRADEMARK OFFICE
CERTIFICATE OF CORRECTION

PATENT NO. : 5,208,102

DATED : May 4, 1993

INVENTOR(S) : Schulz, H.; Zehenter, K.; Bergmann, E.

It is certified that error appears in the above-identified patent and that said Letters Patent is hereby corrected as shown below:

Column 8, line 1, change "5" to --50--.

Signed and Sealed this

Seventeenth Day of May, 1994

*Attest:*

BRUCE LEHMAN

*Attesting Officer*     *Commissioner of Patents and Trademarks*